(12) United States Patent
Mathew et al.

(10) Patent No.: US 7,566,623 B2
(45) Date of Patent: Jul. 28, 2009

(54) ELECTRONIC DEVICE INCLUDING A SEMICONDUCTOR FIN HAVING A PLURALITY OF GATE ELECTRODES AND A PROCESS FOR FORMING THE ELECTRONIC DEVICE

(75) Inventors: Leo Mathew, Austin, TX (US); Brian J. Goolsby, Austin, TX (US); Tab A. Stephens, Buda, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 5 days.

(21) Appl. No.: 11/670,833

(22) Filed: Feb. 2, 2007

(65) Prior Publication Data

US 2008/0185654 A1 Aug. 7, 2008

(51) Int. Cl.
*H01L 21/336* (2006.01)
(52) U.S. Cl. .................... 438/283; 257/365
(58) Field of Classification Search ........... 438/283
See application file for complete search history.

(56) References Cited

U.S. PATENT DOCUMENTS

| 5,994,009 | A | 11/1999 | Tzu et al. |
| 6,260,949 | B1 * | 7/2001 | Smith et al. ............ 347/44 |
| 6,893,800 | B2 | 5/2005 | Jessen et al. |
| 2002/0163012 | A1 * | 11/2002 | Nihei et al. ............ 257/194 |
| 2003/0143862 | A1 * | 7/2003 | Iyer ...................... 438/758 |
| 2004/0235300 | A1 | 11/2004 | Mathew et al. |
| 2006/0197147 | A1 * | 9/2006 | Anderson et al. ........ 257/331 |
| 2008/0044964 | A1 * | 2/2008 | Kamath et al. .......... 438/164 |

FOREIGN PATENT DOCUMENTS

| WO | 2001051993 A1 | 7/2001 |
| WO | 2005078804 A1 | 8/2005 |

* cited by examiner

*Primary Examiner*—Thao X Le
*Assistant Examiner*—Kimberly Trice

(57) ABSTRACT

An electronic device can include a semiconductor fin with a first gate electrode adjacent to a first wall, and a second gate electrode adjacent to a second wall. In one embodiment, a conductive member can be formed overlying the semiconductor fin, and a portion of the conductive member can be reacted to form the first and second gate electrodes. In another embodiment, a patterned masking layer can be formed including a masking member over a gate electrode layer, and portion of the masking member overlying the semiconductor fin can be removed. In still another embodiment, a first fin-type transistor structure can include the semiconductor fin, the first and second gate electrodes, and a first insulating cap. The electronic device can also include a second fin-type transistor structure having a second insulating cap thicker than the first insulating cap.

20 Claims, 9 Drawing Sheets

ELECTRONIC DEVICE INCLUDING A SEMICONDUCTOR FIN HAVING A PLURALITY OF GATE ELECTRODES AND A PROCESS FOR FORMING THE ELECTRONIC DEVICE

BACKGROUND

1. Field of the Disclosure

The present disclosure relates to electronic devices, more particularly, to electronic devices that include semiconductor fins having a plurality of gate electrodes and processes for forming them.

2. Description of the Related Art

Electronic devices, including a fin-type component having a first gate electrode along a first side and a second gate electrode along a second side of a semiconductor fin, can be difficult to manufacture. One attempt is to form separate first and second masking members with a gap between them prior to etching a gate electrode layer. However, the width of the fin, the distance from the first side of the semiconductor fin to the second side of the semiconductor fin can be close to the limit of the lithography process. Consistently resolving a gap on top of the semiconductor fin at substantially minimum spacing for the lithography process can be difficult to accomplish.

Another attempt is to form a single conductive member that overlies the fin-type structure, and later separate the single conductive member into two gate electrodes using an additional masking layer and separation etch process. However, performing such a process has overlay issues because one masking layer is required to form the conductive member over the semiconductor fin, and a second masking layer is required to protect the gate electrode portions of the conductive member during the separation etch process. Additional masking layers add complexity and expense to the process.

The conductive member can also be separated by chemical mechanical planarization to avoid performing the additional masking operation. However, chemical mechanical planarization has a global effect, so all gate members at the same elevation will separate at substantially the same time. Integration of chemical mechanical planarization is also difficult and expensive if dual gate and single gate components are to be integrated within a single electronic device.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
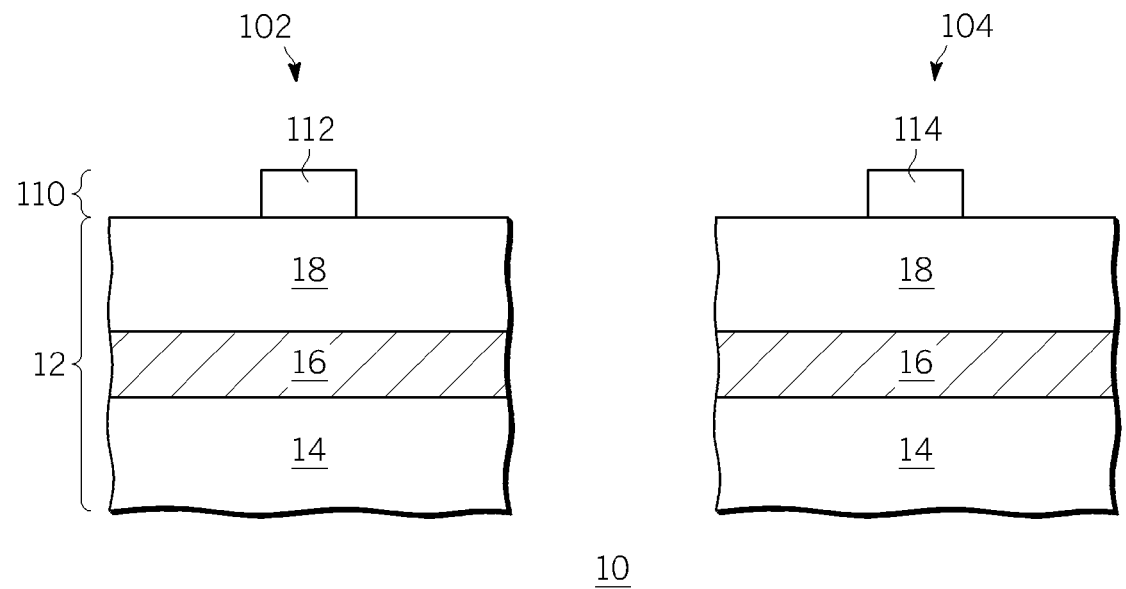
FIG. 1 includes an illustration of a cross-sectional view of a workpiece including a patterned masking layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include a semiconductor fin with a first gate electrode adjacent to a first wall, and a second gate electrode adjacent to a second wall. In accordance with a first embodiment, a conductive member can be formed overlying the semiconductor fin, and a portion of the conductive member can be reacted to form the first and second gate electrodes. In accordance with a second embodiment, a patterned masking layer can be formed and include a masking member over a gate electrode layer and the semiconductor fin. A portion of the masking member over the semiconductor fin can be removed prior to etching the gate electrode layer and forming the first gate electrode and the second gate electrode. In accordance with a third embodiment, an electronic device can include fin-type transistor structures including semiconductor fins and insulating caps. The thickness of the insulating caps can be different from each other.

As will be described below in more detail, an electronic device can be formed including electrode components having two gate electrodes that can be independently controlled, a single gate electrode, or any combination thereof by modifying a masking layer. The electronic device can be made without performing additional operations as compared to the single gate electrode component formation process. Thus, single-gated and dual-gated electronic components can be more easily integrated onto a single integrated circuit. Specific embodiments of the present disclosure will be better understood with reference to FIGS. 1 through 18.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes an illustration of cross-sectional views of a substrate 12 where electronic components are being formed at a location 102 and a location 104. In the illustrated embodiment, the substrate 12 is a semiconductor-on-insulator ("SOI") substrate that includes a base layer 14, an insulating layer 16, and a semiconductor layer 18. The base layer 14 includes a support layer and provides mechanical support for the other layers of the substrate 12. The base layer 14 can include substantially any material physically strong enough to support the substrate 12 and compatible with the subsequent processing. In a particular embodiment, the base layer 14 includes a semiconductor material.

As illustrated, the insulating layer 16 is a buried insulating layer and provides electrical insulation between the base layer 14 and the semiconductor layer 18. The insulating layer 16 includes an oxide, a nitride, an oxynitride, or any combination thereof and can be formed using a conventional or proprietary process. The semiconductor layer 18 includes a semiconductor material such as silicon, germanium, carbon, another semiconductor material, such as a III-V or a II-VI material, or any combination thereof. The semiconductor layer 18 has a substantially uniform thickness in a range of approximately 50 to approximately 150 nm. In one embodiment, the semiconductor layer 18 includes either fully or partially depleted n-type active semiconductor region, p-type active semiconductor region, or any combination thereof. In the illustrated embodiment, the location 102 and the location 104 can each include the same or different dopant-type.

A protective layer 110 overlies the semiconductor layer 18. In the illustrated embodiment, the protective layer 110 includes an insulating cap 112 at the location 102 and an insulating cap 114 at the location 104. The protective layer 110 acts as a hard mask that protects a portion of the semiconductor layer 18 at the location 102 and the location 104 during subsequent processing. The protective layer 110 includes an oxide, a nitride, an oxynitride, or any combination thereof. The protective layer 110 is deposited using a conventional or proprietary physical vapor deposition ("PVD") process, chemical vapor deposition ("CVD") or atomic layer deposition ("ALD") process or thermally grown, and is patterned using a conventional or proprietary lithographic process. In one embodiment, a portion of the insulating cap 112 and the insulating cap 114 each have a thickness substantially the same as the deposited thickness of the protective layer 110. The protective layer 110 has a thickness in a range of approximately 10 to approximately 100 nm and, in a particular embodiment, has a thickness of approximately 40 nm. Although illustrated here as an SOI substrate, in another embodiment, the substrate 12 includes another substrate such as a bulk semiconductor wafer, a semiconductor on sapphire substrate, or the like.

Figure 2:
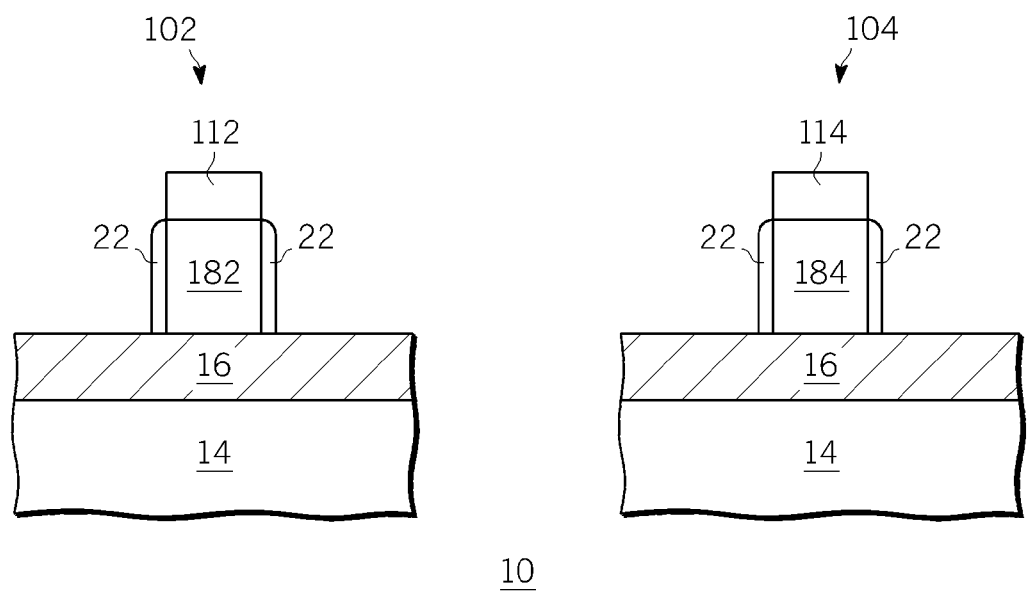
FIG. 2 includes an illustration of a cross-sectional view of the workpiece of FIG. 1 after forming dielectric layer adjacent to a semiconductor fin.

FIG. 2 includes a cross-sectional view of an illustration of the workpiece 10 of FIG. 1 after patterning the semiconductor layer 18 to form a semiconductor fin 182 at a location 102 and a semiconductor fin 184 at a location 104. In the illustrated embodiment, exposed portions of the semiconductor layer 18 are removed using a conventional or proprietary etch process to leave the semiconductor fin 182 and the semiconductor fin 184, each including a first wall and a second wall opposite the first wall. In a particular embodiment, the semiconductor fin 182 has a width, which is a shortest distance separating the first wall and the second wall.

A gate dielectric layer 22 is then formed along exposed surfaces of the semiconductor fin 182 and the semiconductor fin 184. The gate dielectric layer 22 includes a dielectric material such as silicon dioxide, silicon nitride, silicon oxynitride, a high dielectric constant ("high-k") material (e.g., dielectric constant greater than 8), or any combination thereof. During the formation process, the gate dielectric layer 22 is deposited along or grown from an exposed surface of the semiconductor layer 18 using a conventional or proprietary CVD technique, PVD technique, ALD technique, thermal oxidation, thermal nitridation, or any combination thereof. As illustrated, the gate dielectric layer 22 is grown from first and second walls of the semiconductor fin 182 and the semiconductor fin 184. In another embodiment (not illustrated), additional masking and etch processes are performed when the gate dielectric layer 22 is deposited. The gate dielectric 22 has a thickness in a range of approximately 1 to approximately 15 nm.

Figure 3:
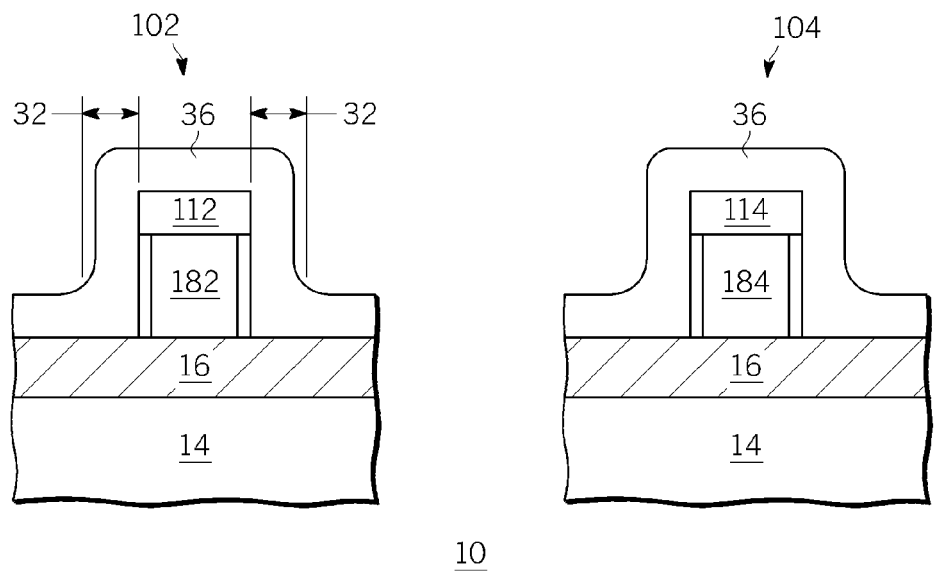
FIG. 3 includes an illustration of a cross-sectional view of the workpiece of FIG. 2 after forming an electrode layer over the semiconductor fin.

FIG. 3 includes an illustration of a cross-sectional view of the workpiece 10 of FIG. 2 after forming a gate electrode layer 36 over the semiconductor fin 182 and the semiconductor fin 184. Portions of the gate electrode layer 36 subsequently serve as conductive members, and more particularly, gate electrodes of an electronic component. In a particular embodiment, the gate electrode layer 36 includes a metal-containing portion that substantially sets the work function of a gate electrode subsequently formed from the gate electrode layer 36. In the illustrated embodiment, the gate electrode layer 36 includes wall portions 32 adjacent to the first wall and the second wall of the semiconductor fin 182.

In a particular embodiment, the gate electrode layer 36 is deposited using a substantially conformal process, and the wall portions 32 have a dimension in a direction substantially perpendicular to the wall of the semiconductor fin 182 or the semiconductor fin 184 that is substantially the same as the deposited thickness of the gate electrode layer 36. The gate electrode layer 36 includes a conductive material conventionally used in forming gate electrodes of semiconductor devices, such as a heavily doped semiconductor material or a metal-containing material, such as a metal oxide, a metal nitride, a metal-semiconductor material, a metal alloy, or any combination thereof. The gate electrode layer 36 is deposited using a conventional or proprietary CVD process, PVD process, ALD process, or any combination thereof. The gate electrode layer 36 has a thickness of at least approximately 10 nm, and in one embodiment, has a thickness in a range of approximately 20 to approximately 150 nm. In another embodiment, the gate electrode layer 36 can include a lightly doped or undoped semiconductor material.

Figure 4:
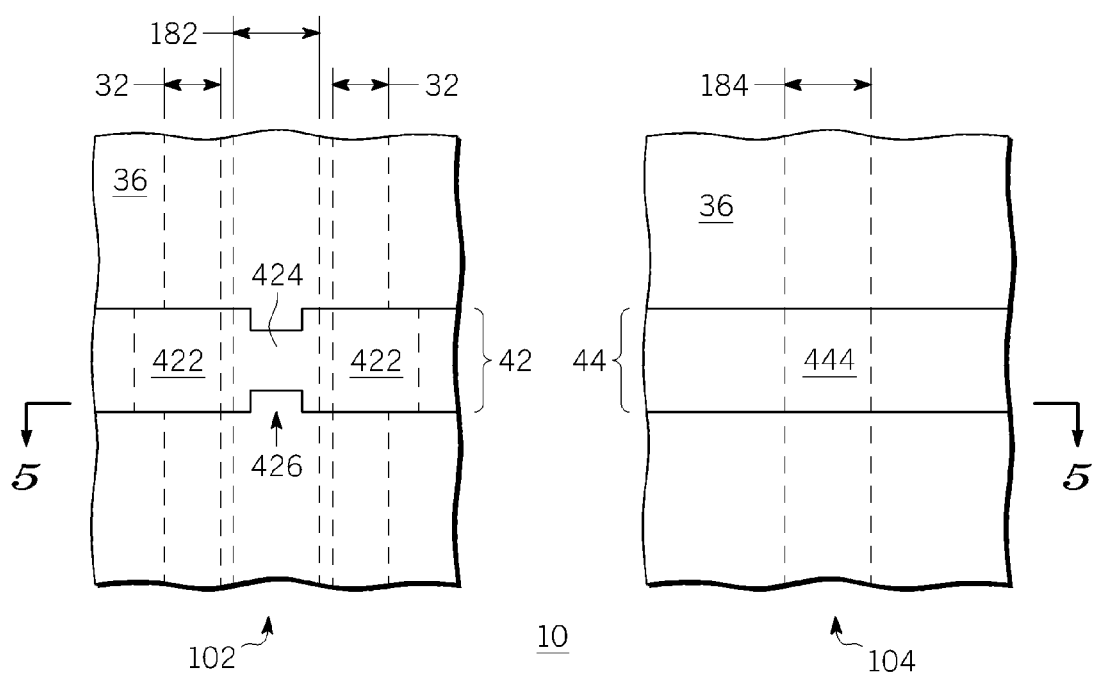
FIGS. 4 and 5 include illustrations of a top view and a cross-sectional view, respectively, of the workpiece of FIG. 3 after forming a masking layer over the gate electrode layer.
Figure 5:
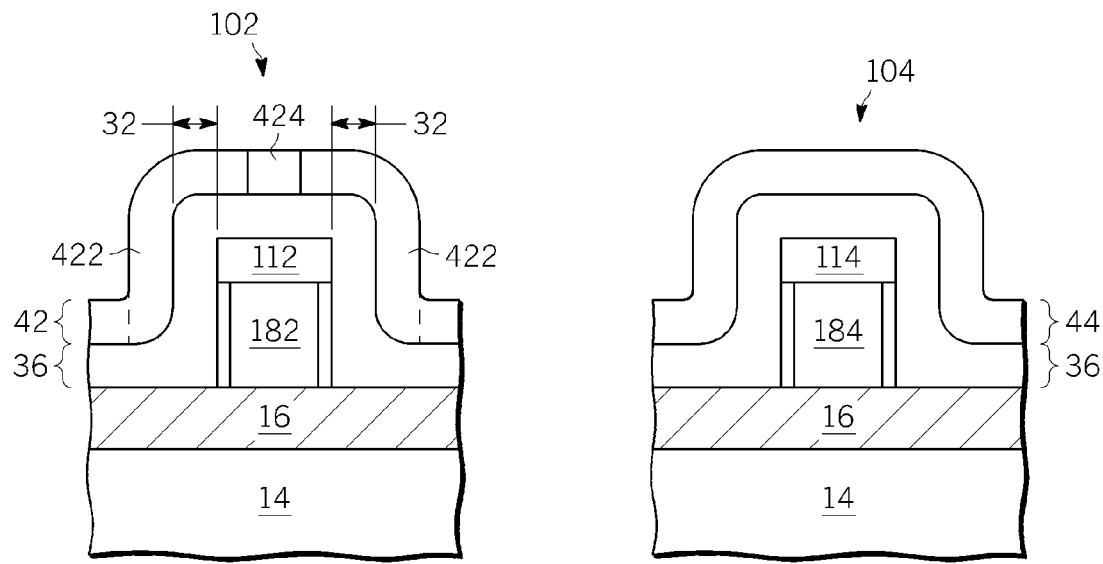

FIGS. 4 and 5 include illustrations of top views and cross-sectional views, respectively, of the workpiece 10 of FIG. 3 after forming a patterned masking layer including a masking member 42 at the location 102 and a masking member 44 at the location 104. Here, and elsewhere within this specification, some overlying layers are not illustrated in top view to better describe the relative positions of underlying structures of the electronic device. The patterned masking layer serves to protect underlying portions of the gate electrode layer 36 during subsequent processing. The patterned masking layer is deposited over the workpiece 10 using a conventional or proprietary lithographic process and includes the masking member 42 at the location 102 and the masking member 44 at the location 104. In one embodiment, the masking member 42 at the location 102 and the masking member 44 at the location 104 have substantially the same thickness.

As illustrated in FIGS. 4 and 5, the masking member 42 includes portions 422 adjacent to the walls of the semiconductor fin 182 and a portion 424 connecting the portions 422. In FIG. 4, each of the portions 422 and the portion 424 has a width in a direction substantially parallel to a wall of the semiconductor fin 182 and a length in a direction perpendicular to the width. The portion 424 includes a linking part 426. In one embodiment, the portion 424 includes a plurality of linking parts 426 separated by openings, each linking part 426 having a width less than the thickness of the masking member 42. In another embodiment, the portions 422 each have substantially the same width as the other portion 422. The portion 424 of the masking member 42 overlies the semiconductor fin 182 at the location 102, and in one embodiment, has a width less than the portions 422. In a particular embodiment, the width of the portion 424 is less than the thickness of the masking member 42 at the location 102. In another particular embodiment, the length of the portion 424 is less than or equal to approximately the width of the semiconductor fin 182.

The masking member 44 includes a portion 444 overlying the semiconductor fin 184. As illustrated, the portion 444 of the masking member 44 has a width in a direction substantially parallel to a wall of the semiconductor fin 184. In a particular embodiment, the width of the portion 444 is larger than approximately the width of the portion 424. In another embodiment (not illustrated), the width of the portion 444 is greater than approximately the width of the rest of the masking member 44.

Figure 6:
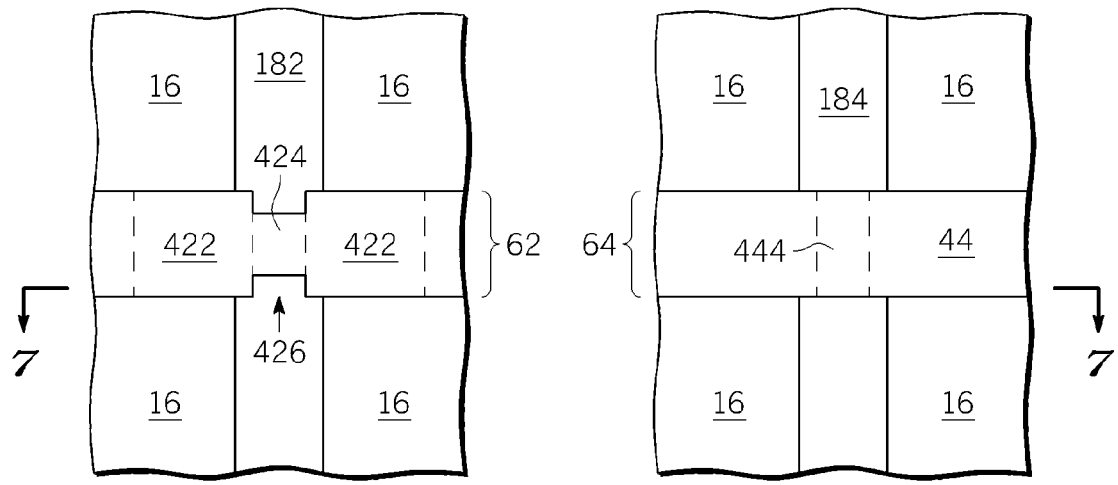
FIGS. 6 and 7 include illustrations of a top view and a cross-sectional view, respectively, of the workpiece of FIGS. 4 and 5 after removing an exposed portion of the gate electrode layer to form a conductive member and a gate electrode.
Figure 7:
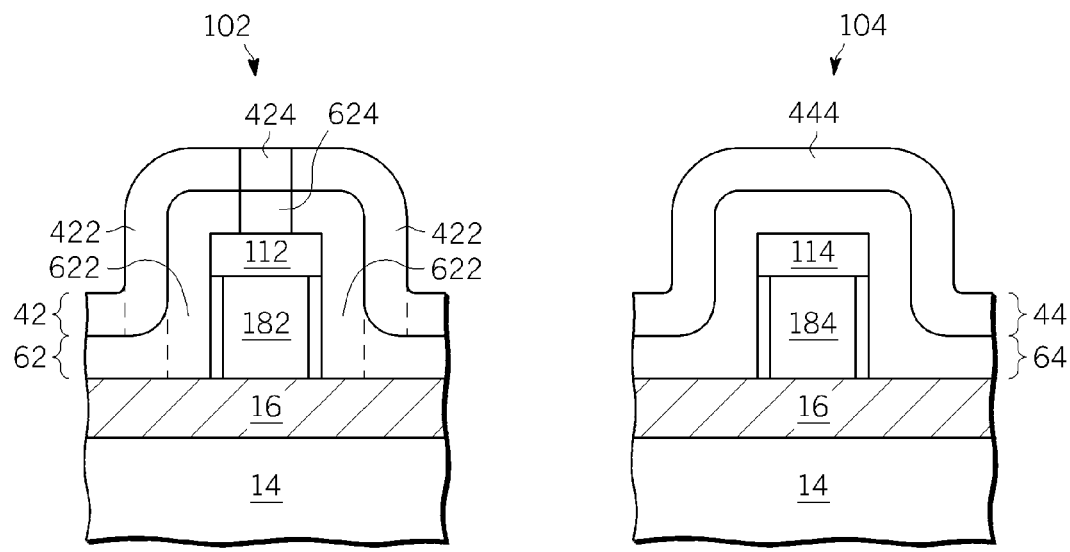

FIGS. 6 and 7 include illustrations of top views and cross-sectional views, respectively, of the workpiece 10 of FIGS. 4 and 5 after leaving a conductive member 62 at the location 102 and a gate electrode 64 at the location 104. Exposed portions of the gate electrode layer 36 are removed using a conventional or proprietary etch process. In one embodiment, a substantially anisotropic etch process is used such that, from a top view, the dimension of the conductive member 62 and the gate electrode 64 resulting from the etch process are substantially the same as the dimensions of the masking member 42 and the masking member 44 as previously described. In a particular embodiment, the portion 424 includes a linking part 426. After the removal of exposed portions of the gate electrode layer 36, the linking part 426 overlies a connective section 626 of the gate electrode layer 36. As used herein, the term "linking part" refers to a feature within a patterned masking layer, and the term "connective section" refers to a feature within a patterned gate electrode layer.

In a particular embodiment, the gate electrode layer 36 is removed selectively with respect to the protective layer 110 so that the semiconductor fin 182 and the semiconductor fin 184 remain protected during the removal process. The patterned masking layer, including the masking member 42 and the masking member 44, is removed from the workpiece 10.

Figure 8:
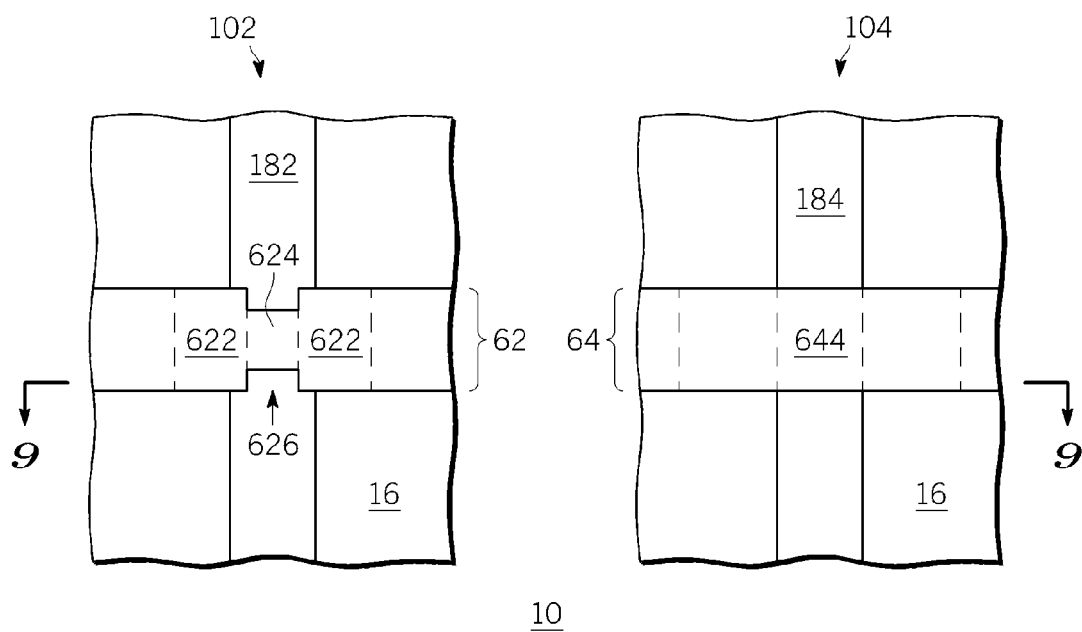
FIGS. 8 and 9 include illustrations of a top view and a cross-sectional view, respectively, of the workpiece of FIGS. 6 and 7 after removing the patterned masking layer.
Figure 9:
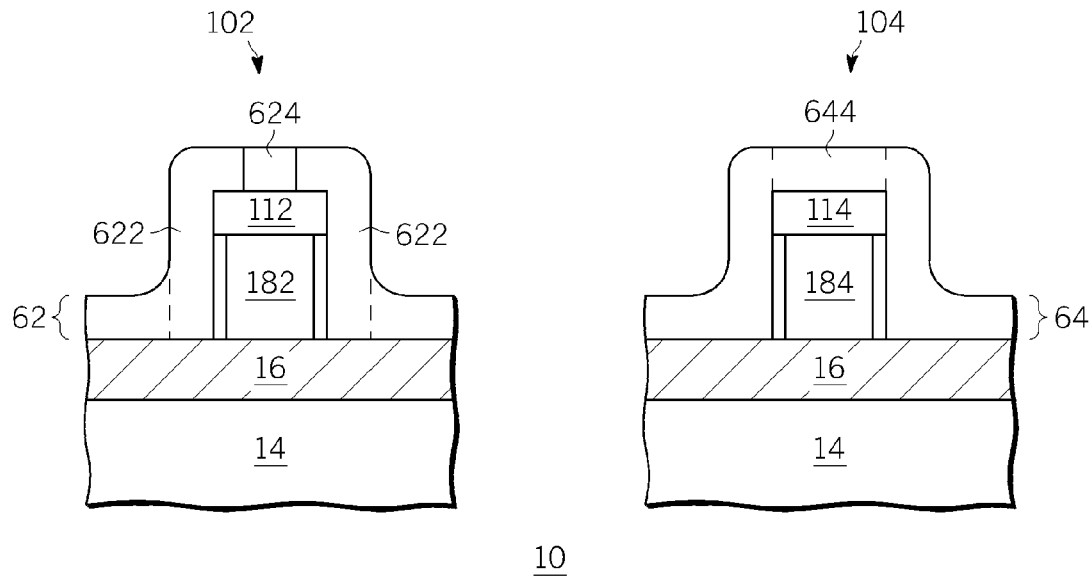

FIGS. 8 and 9 include illustrations of top views and cross-sectional views, respectively, of the workpiece of FIGS. 6 and 7 after removing the patterned masking layer and exposing the conductive member 62 and the gate electrode 64. As illustrated, the conductive member 62 includes portions 622 adjacent to the first wall and the second wall of the semiconductor fin 182, and a portion 624 overlying the semiconductor fin 182 at the location 102. In one embodiment, each of the portions 622 subsequently form a gate electrode. The portion 624 includes the connective section 626 corresponding to the linking part 426 previously described with respect to the masking member 42. In a particular embodiment, the portion 624 includes the connective section 626 having a width less than the thickness of the conductive member 62 at the location 102. Gate electrode 64 includes the portion 644 overlying the semiconductor fin 184. In the illustrated embodiment, the portions 622 each have a substantially same width, and the portion 624 has a width less than each of the widths of the portions 622. In a particular embodiment, the portion 624 has a width less than approximately one half of the width of either of the portions 622. The width of the portion 624 is also less than the width of the portion 644 of the gate electrode 64. In a more particular embodiment, the portion 624 includes a plurality of connective sections 626 separated by openings, wherein no connective section 626 has a width greater than the thickness of the gate electrode layer 36.

Figure 10:
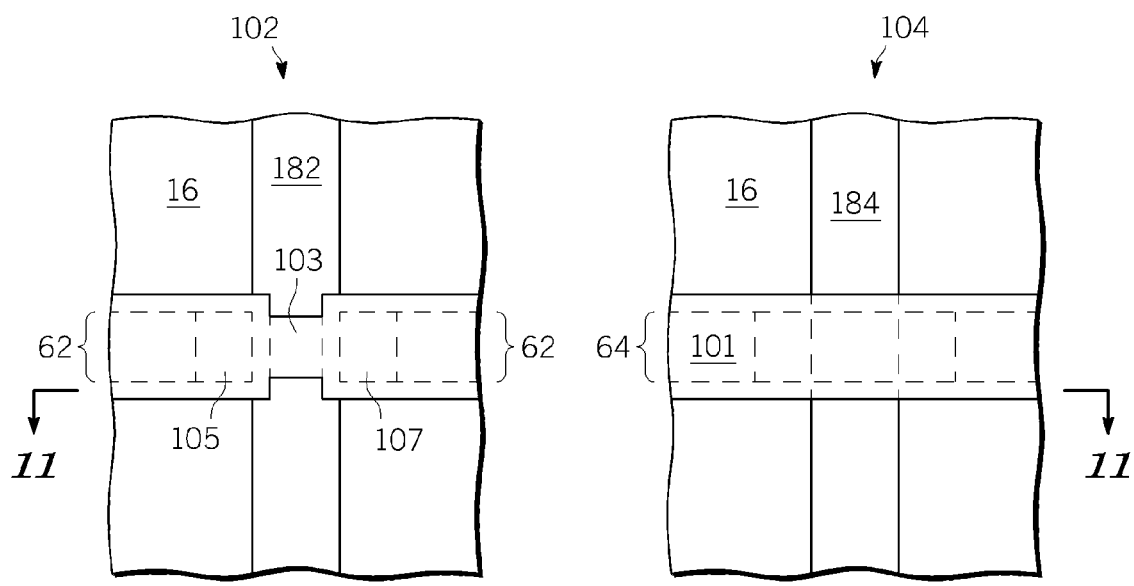
FIGS. 10 and 11 include illustrations of a top view and a cross-sectional view, respectively, of the workpiece of FIGS. 8 and 9 after reacting portion of the conductive members.
Figure 11:
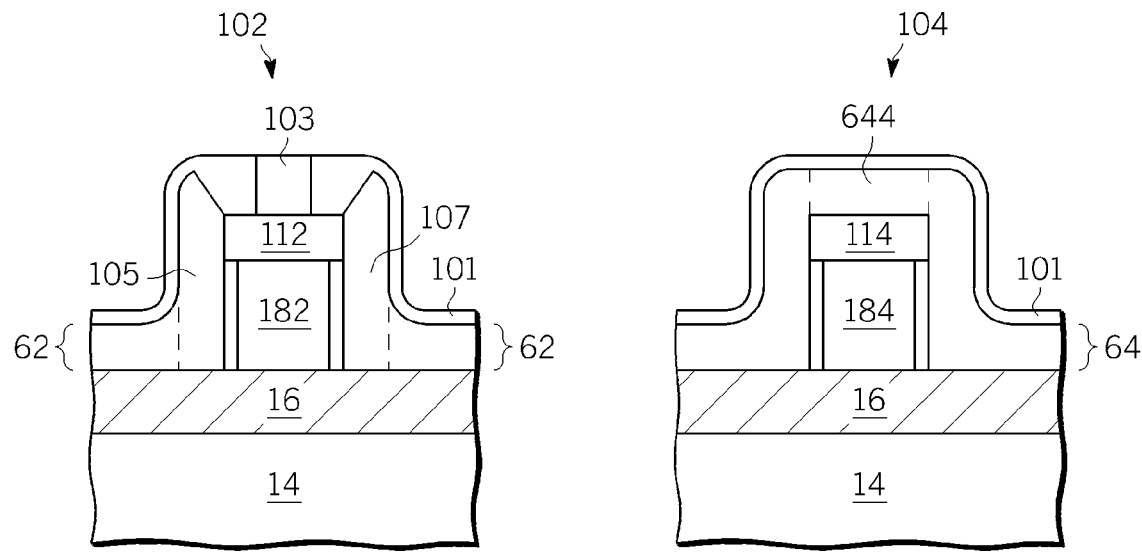

FIGS. 10 and 11 include illustrations of top views and cross-sectional views, respectively, of the workpiece of FIGS. 8 and 9 after forming a gate electrode 105 adjacent to the first wall of the semiconductor fin 182 and a gate electrode 107 adjacent to the second wall of the semiconductor fin 182 at the location 102. In the illustrated embodiment, the conductive member 62 is exposed to a reactive environment. A surface portion of the conductive member 62 is consumed and forms an insulating layer 101 at the location 102. In a particular embodiment, the portion 624 of the conductive member 62 is formed with a smallest dimension smaller than approximately twice the thickness of the insulating layer 101. Thus, after the formation of the insulating layer 101, substantially all of the portion 624 to is converted to an insulating portion 103. As illustrated, the portions 622 of the conductive member 62 are electrically insulated from each other to form the gate electrode 105 adjacent to a first wall of the semiconductor fin 182 and the gate electrode 107 adjacent to a second wall of the semiconductor fin 182. As illustrated, the process also includes forming the insulating layer 101 from the gate electrode 64. The portion 644 of the gate electrode 64 remains after performing the reactive process so that the gate electrode 64 remains a single structure. In one embodiment, the insulating layer 101 has a thickness in a range of approximately 1 to approximately 15 nm. In one embodiment, the reactive process is used to adjust or trim a conductive portion of a fin-type transistor structure to a final dimension.

In another embodiment, the reactive environment includes a thermally oxidizing or nitridizing environment. Such an environment can also include a plasma or other radiant energy source. In a particular embodiment, the reactive environment includes steam, and the insulating layer 101 and the insulating portion 103 include an oxide. In another embodiment, the insulating cap 112 and the insulating cap 114 include a nitride and the reactive environment is an oxidizing environment. In that embodiment, a portion of the insulating cap 112 exposed to the oxidizing environment becomes partially oxidized, while the insulating cap 114 remains substantially protected from the environment by the overlying portion 644 of the electrode layer 64. Thus, a subsequent exposure to an oxide etch can reduce the thickness of the insulating cap 112 relative to the thickness of the insulating cap 114.

Figure 12:
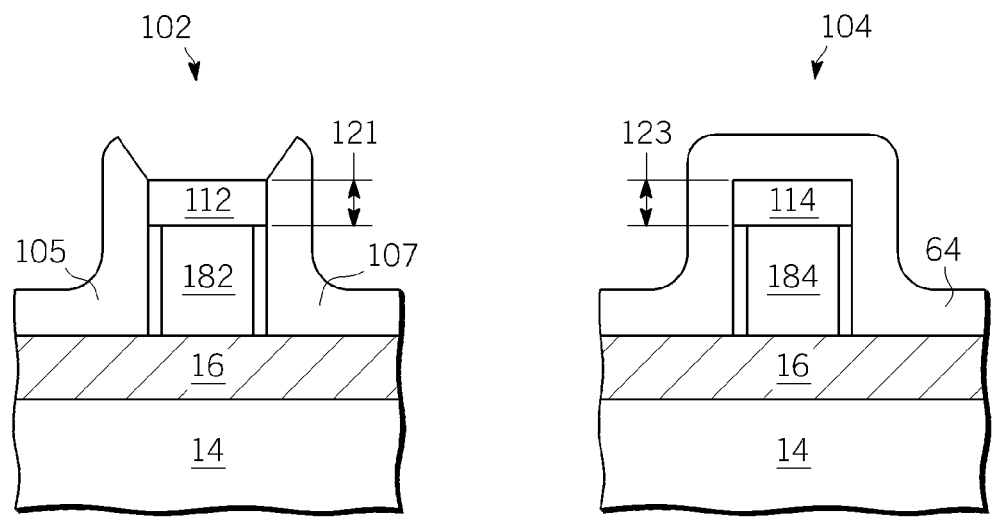
FIG. 12 includes an illustration of a cross-sectional view of the workpiece of FIGS. 10 and 11 after removing a reacted portion of the conductive members.

FIG. 12 includes an illustration of a cross-sectional view of the workpiece 10 of FIGS. 10 and 11 after removing the insulating layer 101 and the insulating portion 103. The workpiece 10 is etched using a conventional or proprietary process to expose the surface of the gate electrode 64, the gate electrode 105, the gate electrode 107, or any combination thereof. In the illustrated embodiment, the etch process is also selective to unreacted portions of the insulating cap 112 and the insulating cap 114. In another embodiment, the etch process is an isotropic etch process. In a particular embodiment, the insulating layer 101 and the insulating portion 103 include an oxide, the insulating cap 112 and the insulating cap 114 includes a nitride, and the insulating cap 112 has been partially oxidized such that a surface portion can be removed during an oxide etch. In that embodiment, after performing the oxide etch, the insulating cap 112 at the location 102 has a thickness 121, and the insulating cap 114 at the location 104 has a thickness 123 thicker than the thickness 121. In a more particular embodiment, the thickness 123 is greater than approximately 1.3 times thicker than the thickness 121. In a still more particular embodiment, the thickness 123 is approximately 40 nm, and the thickness 121 is less than or equal to approximately 30 nm. In another particular embodiment, each of the gate electrode 105 and the gate electrode 107 has a different maximum height adjacent to the semiconductor fin 182. In a more particular embodiment, each of the gate electrode 105 and the gate electrode 107 has a maximum height greater than the height of the semiconductor fin 182.

Figure 13:
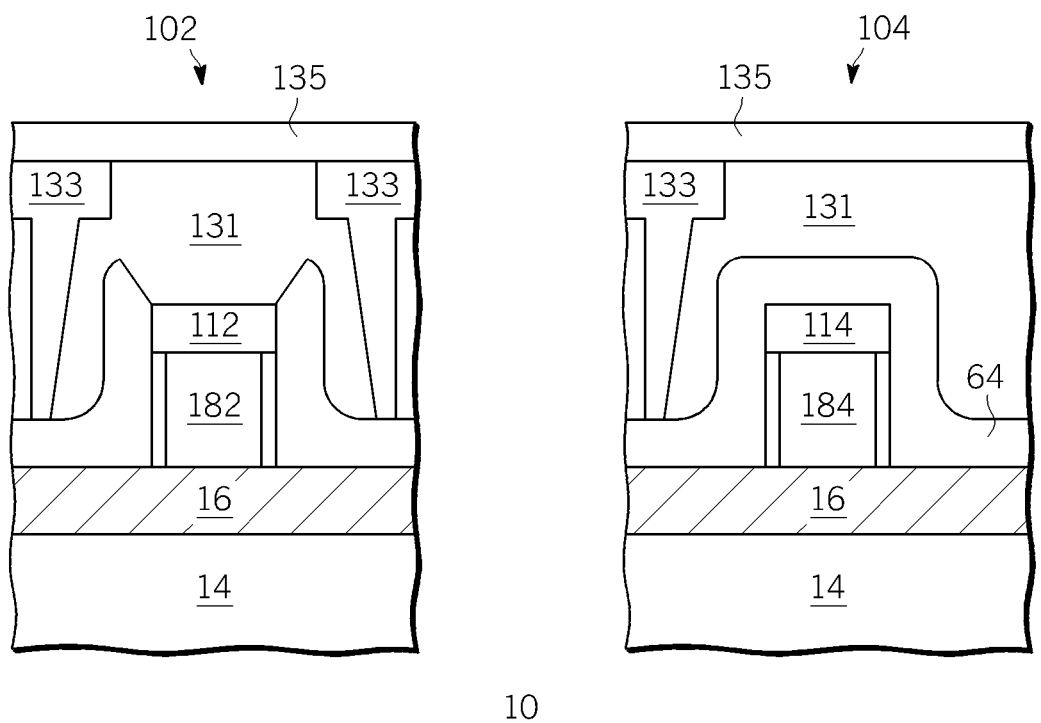
FIG. 13 includes an illustration of a cross-sectional view of a substantially complete electronic device.

FIG. 13 includes an illustration of a cross-sectional view of a substantially completed electronic device. One or more source regions, drain regions, source/drain regions, or any combination thereof (not illustrated) are formed using a conventional or proprietary process to form transistor structures at the locations 102 and 104. As illustrated the transistor structure at the location 102 includes a gate electrode 105 and a gate electrode 107. Also, the transistor structure at the location 104 includes a gate electrode 64. An insulating layer 131, a conductive layer 133, and an encapsulating layer 135 are formed using conventional or proprietary techniques. In another embodiment, a plurality of insulating layers, conductive layers, encapsulating layers, or any combination thereof are used to form the electronic device.

Figure 14:
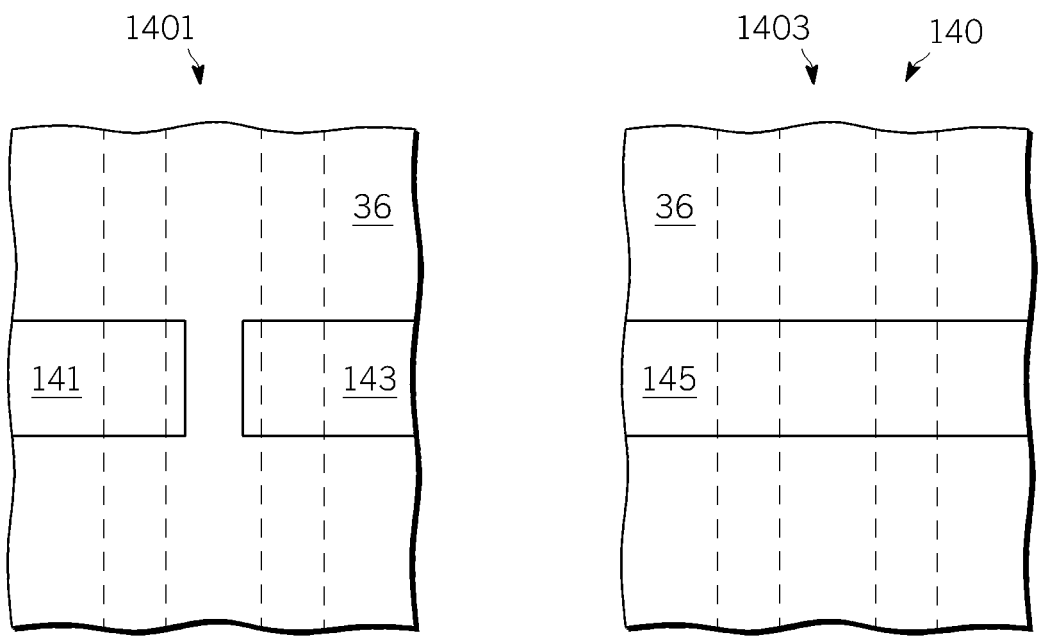
FIGS. 14 and 15 include illustrations of a top view and a cross-sectional view, respectively, of the workpiece of FIGS. 4 and 5 after removing a portion of a masking member in accordance with an alternative embodiment.
Figure 15:
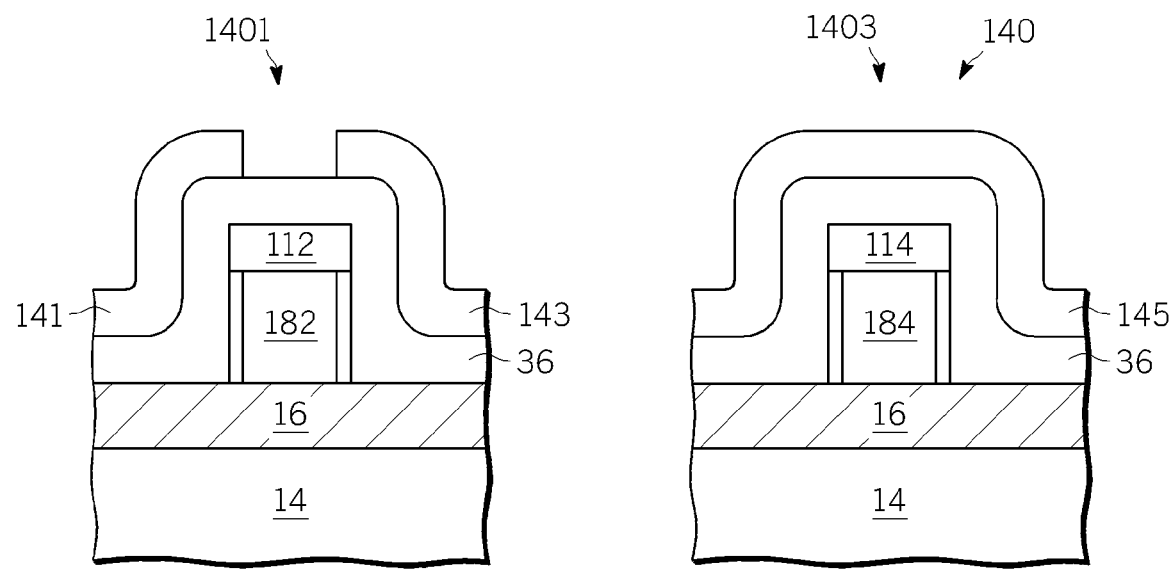

In accordance with an alternative embodiment, after forming the patterned masking layer and before etching the gate electrode layer, a continuous masking member of the patterned masking layer may be separated into discontinuous portions. FIG. 14 includes illustrations of top views of a workpiece 140, including a masking member 141 and a masking member 143 at a location 1401, a masking member 145 at a location 1403 as formed according to an alternative embodiment. FIG. 15 includes illustrations of cross-sectional views of the location 1401 and the location 1403 of the workpiece 140 at substantially the same point in the process as is illustrated in FIG. 14. As illustrated, the FIG. 15 includes the semiconductor fin 182, the semiconductor fin 184, the insulating cap 112, and the insulating cap 114. The workpiece 140 also includes the base layer 14 and the buried insulating layer 16 as previously described for the workpiece 10.

Processing proceeds according to an embodiment as previously described for the FIGS. 1 through 5. A patterned masking layer is formed over the workpiece 140 including the masking member 42 and the masking member 44. In one embodiment, masking member 42 of the workpiece 140 includes a portion 424 having the linking part 426 as illustrated in FIG. 4. The workpiece 140 is then exposed to a reactive environment that reacts with the patterned masking layer selectively to a gate electrode layer 36. Exposure to the reactive environment removes a portion of the patterned masking layer. The linking part 426 of the portion 424 is substantially removed, leaving the masking members 141, 143, and 145 over the workpiece 140 as illustrated in FIGS. 14 and 15. Removing the portion of the patterned masking layer narrows the masking members 141, 143, and 145 in width. In one embodiment, the masking members 141, 143, and 145 are narrower in width than the masking members 42 and 44 by at least the width of the linking part 426 of the portion 424. In another embodiment, exposure to the reactive environment is used to adjust or trim the masking member 42, the masking member 44, or any combination thereof, prior to performing the gate etch process.

Processing proceeds according to an embodiment as previously described with respect to FIGS. 6 through 13, except that the portion 424 of the patterned masking layer has been removed. Thus, the portion of the gate electrode layer 36 corresponding to the portion 624 of the conductive member 62 is removed during the gate etch process.

Figure 16:
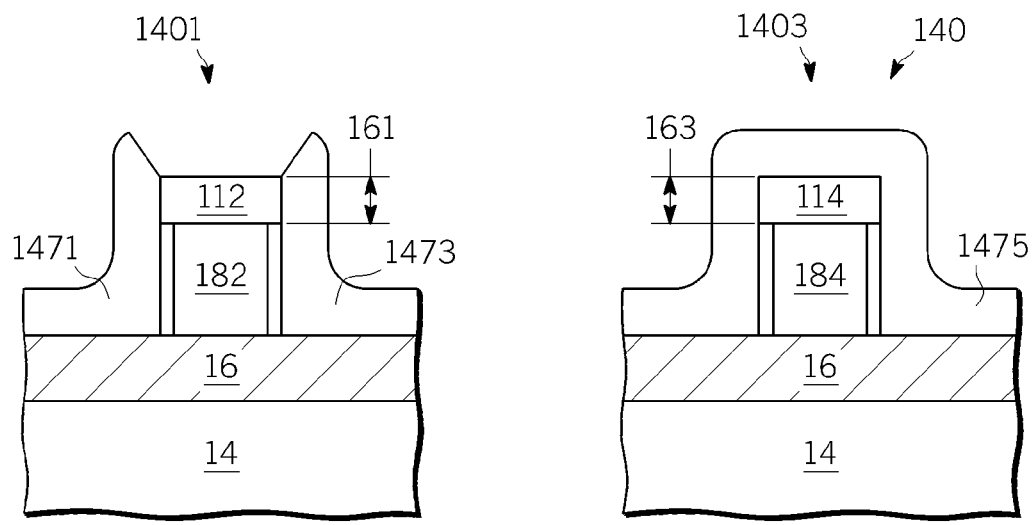
FIG. 16 includes illustrations of a cross-sectional view of the workpiece of 14 and 15 after removing an exposed portion of the gate electrode layer to form conductive members.

FIG. 16 includes an illustration of the workpiece 140 at a point in processing previously described with respect to FIG. 12. As illustrated, FIG. 16 includes a gate electrode 1471 and a gate electrode 1473 adjacent to the semiconductor fin 182 at the location 1401, and a gate electrode 1475 overlying the semiconductor fin 184 at the location 1403. During processing, a portion of the gate electrode layer 36 is removed to form the gate electrodes 1471, 1473, and 1475. The patterned masking layer is removed. The fin-type transistor structures at the location 1401 and the location 1403 of the workpiece 140 include the insulating cap 112 having a thickness 161 and the insulating cap 114 having a thickness 163. The thickness 163 is thicker than the thickness 161, and in a particular embodiment, the thickness 163 is greater than approximately 1.3 times the thickness 161. In another particular embodiment, the thickness of the insulating cap 112 is reduced during the gate etch operation while the insulting cap 114 is substantially protected by the gate electrode 1475. Processing continues according to an embodiment described herein, to form a substantially complete electronic device.

Figures 17, 18:
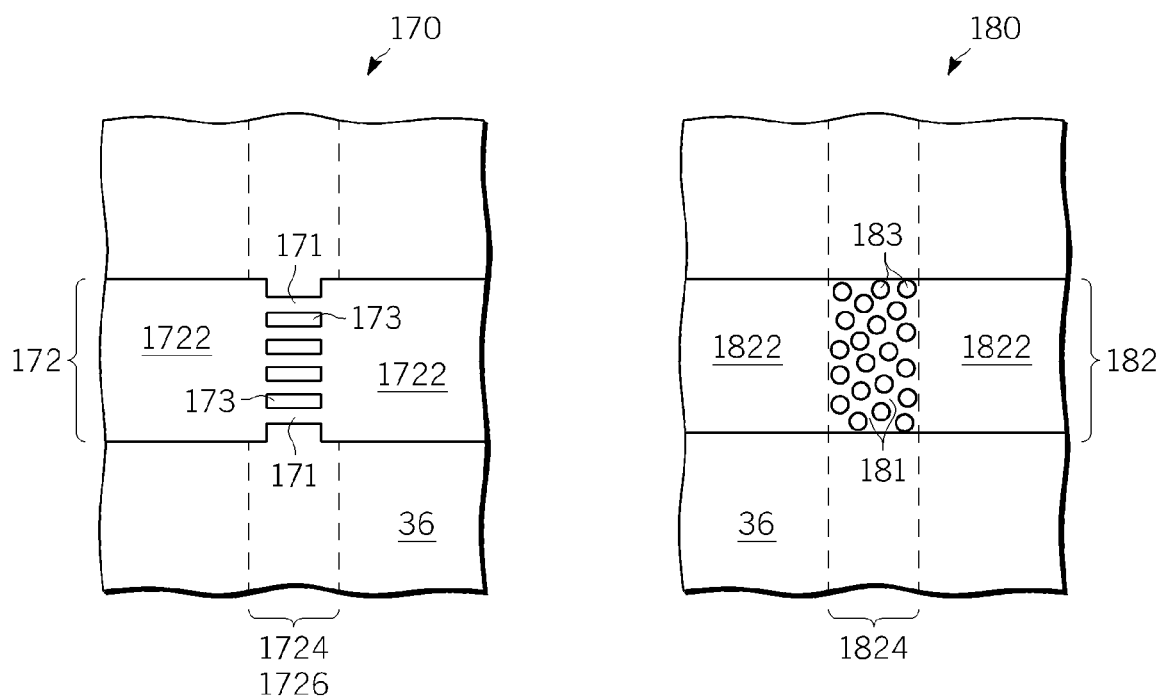
FIGS. 17 and 18 each include an illustration of a top view of a workpiece after forming a patterned masking layer according to alternative embodiments.

Electronic components can be formed having channel lengths significantly larger than the resolution limit of the lithographic equipment and process used to image a masking layer. In one embodiment, the process is adjusted to separate a conductive member having a width wider than the gate electrode 42 of the workpiece 10. FIG. 17 includes an illustration of a top view of a workpiece 170 at a point in process as previously illustrated in FIG. 4. In FIG. 17, the masking member 172 of the workpiece 170 includes portions 1722 and a portion 1724 that connects the portions 1722.

Processing proceeds according to an embodiment as previously described with respect to the FIGS. 1 through 4 and 5, except that the masking member 172 of the workpiece 170 is wider than the masking member 42 of the workpiece 10. In the illustrated embodiment, the portion 1724 includes a plurality of linking parts 171 spaced-apart by openings 173. As described elsewhere within this specification, after performing an etch operation, a linking part 171 of a patterned masking layer corresponds to a connective section (not illustrated) of a gate electrode layer. In a particular embodiment (not illustrated), the portion 1724 includes a single opening separating two linking parts.

In a first process flow, processing proceeds using an embodiment as previously described for the FIGS. 6 through 13 to form a workpiece 170 of FIG. 17. After performing the gate etch, the workpiece 170 includes a portion 1724. The portion 1724 includes a plurality of connective sections 176, and no connective section 176 of the plurality of connective sections 176 has a width greater than the thickness of the gate electrode layer 36. In that embodiment, substantially all of each connective section 176 of the plurality of connective sections 176 is reacted to form an insulating material using an embodiment as described with respect to the connective section 626 of portion 624 of the workpiece 10. Processing continues according to an embodiment described herein, to form a substantially complete electronic device.

In a second process flow, the workpiece 170 is processed by an embodiment described with respect to FIG. 14. The masking member 172 is separated into discontinuous portions prior to performing the gate etch process on the gate electrode layer 36. In those embodiments, each linking part 171 of the plurality of linking parts 171 is reacted as described with respect to the linking part 426 of the workpiece 140 and the FIG. 14. Thus, the masking member 172 is separated into discontinuous portions, and two distinct gate electrodes are formed during the gate etch process. Processing continues according to an embodiment described herein, to form a substantially complete electronic device.

In other embodiments, the openings 173, which are illustrated as substantially rectangular in shape, are replaced by other shapes. For example, FIG. 18 includes an illustration of a top view of a workpiece 180 that includes openings 183. The openings 183 are substantially circular. In other embodiments, the openings have substantially any closed shape, such as a triangle shape, a kidney shape, a quadrilateral shape, or combination of shapes. In another embodiment (not illustrated), the pattern of the openings is in the form of an irregular pattern.

Referring to FIG. 18, the workpiece 180, a masking member 182, portions 1822, and a portion 1824 are substantially analogous to the workpiece 170, the masking member 172, the portions 1722, and the portion 1724, respectively, as described with respect to FIG. 17. The patterns and shapes of linking portions 181 and the openings 183 of the workpiece 180 in FIG. 18 are different from the linking portions 171 and the openings 173 of the workpiece 170 in FIG. 17. Still, each of the widths of the linking sections 181 is less than the thickness of the masking member 182. The workpiece 180 is formed using any of the embodiments as described with respect to the workpiece 170. After forming the patterned masking layer, either of the two process flows as described with respect to the workpiece 170 can be used for the workpiece 180.

As disclosed herein, an electronic device includes a semiconductor fin with a first gate electrode adjacent to a first wall, and a second gate electrode adjacent to a second wall. In a particular embodiment, an electronic device that includes a single-gated fin-type transistor structure and a dual-gated fin-type transistor structure are formed by simply changing a masking layer and without any additional processing as compared to a process used to form an electronic device having fin-type transistor structures that are only single gated. Additionally, the process is modified to accommodate transistor structures having a variety of gate widths. By adjusting the formation of a masking member over a semiconductor fin relative to another masking member over another semiconductor fin, a trim process is used to separate a continuous member into two discontinuous portions without requiring an additional masking layer.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a first semiconductor fin, wherein from a cross-sectional view, the first semiconductor fin includes a first wall and a second wall opposite the first wall. The process can also include forming a first conductive member can include a gate electrode material. The first conductive member can include a first portion adjacent to the first wall, a second portion adjacent to the second wall, and a third portion overlying the semiconductor fin and connecting the first portion and the second portion. The process can further include reacting the third portion of the first conductive member to form a first gate electrode adjacent to the first wall and a second gate electrode adjacent to the second wall.

In a first aspect, prior to reacting the third portion of the first conductive member the first portion has a first width, the second portion has a second width substantially a same width as the first width, and the third portion has a third width less than each of the first width and the second width. In another embodiment, forming the first conductive member can include forming an opening in the third portion. In still another embodiment, prior to reacting the third portion, the third portion can include a plurality of connective sections, each connective section has substantially a thickness, and each connective section has a width smaller than the thickness.

In one embodiment of the first aspect, reacting the third portion can include converting substantially all of the third portion to an insulating portion. In a more particular embodiment, the process can further include removing substantially all of the insulating portion. In still another more particular embodiment, reacting the third portion can include exposing the first conductive member to steam. In another embodiment, the process can further include removing a patterned masking layer after forming the first conductive member and prior to reacting the third portion. Also, forming the first conductive member can include forming a gate electrode layer over the first semiconductor fin, forming the patterned masking layer over the gate electrode layer and including a first masking member overlying the first semiconductor fin. The process can also include removing an exposed portion of the gate electrode layer to form the first conductive member.

In a particular embodiment of the first aspect, the process can also include forming a second semiconductor fin while forming the first semiconductor fin, and forming a second conductive member while forming the first conductive member. Also, the second conductive member can include the gate electrode material and can overlie the second semiconductor fin, and after reacting the third portion of the first conductive member, the second conductive member overlies the second semiconductor fin. In a more particular embodiment, prior to reacting the third portion of the first conductive member the third portion has a first width, and a portion of the second conductive member overlying the second semiconductor fin has a second width larger than the first width.

In a second aspect, a process of forming an electronic device can include forming a first semiconductor fin over a substrate, wherein the first semiconductor fin includes a first wall and a second wall opposite the first wall. The process can also include forming a gate electrode layer over the first semiconductor fin. The process can further include forming a patterned masking layer over the gate electrode layer including a first masking member including a first portion adjacent to the first wall and overlying a first region of the substrate. The first masking member can also include a second portion adjacent to the second wall and overlying the first region of the substrate, a third portion connecting the first portion and the second portion of the first masking member and overlying a second region of substrate, and an opening over the second region of the substrate. The process can still further include removing the third portion of the first masking member, and removing the gate electrode layer overlying the second region of the substrate to form a first gate electrode along the first wall and a second gate electrode along the second wall.

In one embodiment of the second aspect, forming the electronic device can include forming the electronic device such that the first wall and the second wall are separated by a first distance. Further, from a top view, the first portion of the first masking member can be spaced apart from the second portion of the first masking member by second distance after removing the gate electrode layer overlying the second region. Also, the second distance can be less than or equal to approximately the first distance. In another embodiment, forming the gate electrode layer can include forming a metal-containing layer that substantially sets the work function for the first gate electrode.

In a particular embodiment of the second aspect, forming the patterned masking layer can include forming the opening extending through the third portion of the first masking member. In a more particular embodiment, the third portion further can include a plurality of linking parts, wherein each of the linking parts has a thickness and a width smaller than the thickness. In another embodiment, the process can further include forming a second semiconductor fin while forming the first semiconductor fin. Also, forming the patterned masking layer further includes forming a second masking member over the second semiconductor fin and the first region of the substrate. Further, removing the gate electrode layer overlying the second region of the substrate includes forming a third gate electrode over the second semiconductor fin. In still another embodiment, prior to removing the third portion of the first masking member, the third portion of the first masking member can have a first width and a portion of the second masking member overlying the second semiconductor fin can have a second width larger than the first width.

In a third aspect, an electronic device can include a first fin-type transistor structure including a first semiconductor fin, wherein from a cross-sectional view, the first semiconductor fin includes a first wall and a second wall opposite the first wall, and a first gate electrode adjacent to the first wall. The first fin-type transistor structure can also include a second gate electrode adjacent to the second wall, wherein the second gate electrode is electrically insulated from the first gate electrode, and a first insulating cap overlying the first semiconductor fin and having a first thickness. The electronic device can also include a second fin-type transistor structure including a second semiconductor fin, a third gate electrode overlying the second semiconductor fin, and a second insulating cap lying between the second semiconductor fin and the third gate electrode, wherein the second insulating cap has a second thickness greater than the first thickness.

In one embodiment of the third aspect, the second thickness is greater than approximately 1.3 times the first thickness. In another embodiment, the first gate electrode can have a first maximum height adjacent to the first wall, and the second gate electrode can have a second maximum height adjacent to the second wall, the second maximum height different from the first maximum height. Also, the first semiconductor fin can have a third height less than the first maximum height or the second maximum height.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    forming a first semiconductor fin and a second semiconductor fin, wherein from a cross-sectional view, the first semiconductor fin includes a first wall and a second wall opposite the first wall;
    forming a first conductive member and a second conductive member each including a gate electrode material, wherein:
        the first conductive member includes:
            a first portion adjacent to the first wall;
            a second portion adjacent to the second wall; and
            a third portion overlying the first semiconductor fin and connecting the first portion and the second portion; and
        the second conductive member overlies the second semiconductor fin: and
    reacting the third portion of the first conductive member to form a first gate electrode adjacent to the first wall and a second gate electrode adjacent to the second wall, wherein:
        prior to reacting the third portion of the first conductive member:
            the third portion has a first width: and
            a portion of the second conductive member overlying the second semiconductor fin has a second width larger than the first width: and
        after reacting the third portion of the first conductive member, the second conductive member overlies the second semiconductor fin.

2. The process of claim 1, wherein prior to reacting the third portion of the first conductive member:
    the first portion has a first width;
    the second portion has a second width substantially a same width as the first width; and
    the third portion has a third width less than each of the first width and the second width.

3. The process of claim 1, wherein forming the first conductive member comprises forming an opening in the third portion.

4. The process of claim 3, wherein prior to reacting the third portion:
the third portion includes a plurality of connective sections;
each connective section has substantially a thickness; and
each connective section has a width smaller than the thickness.

5. The process of claim 1, wherein reacting the third portion comprises converting substantially all of the third portion to art insulating portion.

6. The process of claim 5, further comprising removing substantially all of the insulating portion.

7. The process of claim 6, wherein removing substantially all of the insulating portion comprises etching the insulating portion.

8. The process of claim 5, wherein reacting the third portion includes exposing the first conductive member to steam.

9. The process of claim 1, farther comprising removing a patterned masking layer after forming the first conductive member and prior to reacting the third portion, and wherein forming the first conductive member includes:
forming a gate electrode layer over the first semiconductor fin;
forming the patterned masking layer over the gate electrode layer and including a first masking member overlying the first semiconductor fin; and
removing an exposed portion of the gate electrode layer to form the first conductive member.

10. The process of claim 1, wherein reacting the third portion of the first conductive member comprises exposing the third portion to a nitridizing environment.

11. The process of claim 1, wherein reacting the third portion of the first conductive member comprises exposing the third portion to a plasma or a radiant energy source.

12. A process of forming an electronic device comprising:
forming a first semiconductor fin, wherein from a cross-sectional view, the first semiconductor fin includes a first wall and a second wall opposite the first wall;
forming a first conductive member including a gate electrode material, wherein the first conductive member includes:
a first portion adjacent to the first wall, wherein the first portion has a first width;
a second portion adjacent to the second wall, wherein the second portion has a second width substantially a same width as the first width; and
a third portion overlying the semiconductor fin and connecting the first portion and the second portion, wherein the third portion has a third width less than each of the first width and the second width;
reacting the third portion of the first conductive member to form a first gate electrode adjacent to the first wall and a second gate electrode adjacent to the second wall, wherein reacting the third portion includes converting substantially all of the third portion to an insulating portion; and
removing substantially all of the insulatine portion.

13. The process of claim 12, further comprises:
forming a second semiconductor fin while forming the first semiconductor fin; and
forming a second conductive member while forming the first conductive member, wherein:
the second conductive member includes the gate electrode material and overlies the second semiconductor fin; and
after reacting the third portion of the first conductive member, the second conductive member overlies the second semiconductor fin.

14. The process of claim 13, wherein prior to reacting the third portion of the first conductive member:
the third portion has a first width; and
a portion of the second conductive member overlying the second semiconductor fin has a second width larger than the first width.

15. The process of claim 12, further comprising removing a patterned masking layer after forming the first conductive member and prior to reacting the third portion, and wherein forming the first conductive member includes:
forming a gate electrode layer over the first semiconductor fin;
forming the patterned masking layer over the gate electrode layer and including a first masking member overlying the first semiconductor fin; and
removing an exposed portion of the gate electrode layer to form the first conductive member.

16. The process of claim 12, further comprising:
forming a second semiconductor fin while forming the first semiconductor fin; and
forming a second conductive member while forming the first conductive member, wherein:
the second conductive member includes the gate electrode material and overlies the second semiconductor fin;
the second conductive member has a substantially uniform width overlying and along sides of the second semiconductor fin: and
a third width of the third portion lion of the first conductive member is less than the substantially uniform width.

17. The process of claim 12, wherein reacting the third portion of the first conductive member comprises thermally oxidizing the third portion.

18. The process of claim 12, wherein reacting the third portion of the first conductive member comprises exposing the third portion to a nitridizing environment.

19. The process of claim 12, wherein reacting the third portion of the first conductive member comprises exposing the third portion to a plasma or a radiant energy source.

20. The process of claim 12, further comprising etching the insulating portion.

* * * * *

UNITED STATES PATENT AND TRADEMARK OFFICE
CERTIFICATE OF CORRECTION

PATENT NO. : 7,566,623 B2 Page 1 of 1
APPLICATION NO. : 11/670833
DATED : July 28, 2009
INVENTOR(S) : Leo Mathew, Brian J. Goolsby and Tab A. Stephens It is certified that error appears in the above-identified patent and that said Letters Patent is hereby corrected as shown below:

Title Page, Item (54) and Column 1, Lines 1 to 5 Title: please change title from "ELECTRONIC DEVICE INCLUDING A SEMICONDUCTOR FIN HAVING A PLURALITY OF GATE ELECTRODES AD A PROCESS FOR FORMING THE ELECTRONIC DEVICE" to --PROCESS OF FORMING AN ELECTRONIC DEVICE INCLUDING A SEMICONDUCTOR FIN HAVING A PLURALITY OF GATE ELECTRODES-- as seen in the Response to Office Action filed March 10, 2008.

Column 12, Line 46, please change "fin: and" to --fin; and--.

Column 12, Line 57, please change "width: and" to --width; and--.

Signed and Sealed this

First Day of June, 2010

David J. Kappos
*Director of the United States Patent and Trademark Office*